(12) United States Patent
De Ridder et al.

(10) Patent No.: US 7,971,734 B2
(45) Date of Patent: Jul. 5, 2011

(54) WAFER BOAT

(75) Inventors: Christianus Gerardus Maria De Ridder, Hoogland (NL); Adriaan Garssen, Doorn (NL)

(73) Assignee: ASM International N.V., Bilthoven (NL)

( * ) Notice: Subject to any disclaimer, the term of this patent is extended or adjusted under 35 U.S.C. 154(b) by 509 days.

(21) Appl. No.: 12/011,981

(22) Filed: Jan. 30, 2008

(65) Prior Publication Data

US 2009/0188874 A1 Jul. 30, 2009

(51) Int. Cl.
*A47G 19/08* (2006.01)
(52) U.S. Cl. .................................... 211/41.18
(58) Field of Classification Search ............. 211/41.18, 211/40, 60.1, 183; 206/710–712, 454, 832–833; 414/935–941
See application file for complete search history.

(56) References Cited

U.S. PATENT DOCUMENTS

| | | | | |
|---|---|---|---|---|
| 4,355,974 A | * | 10/1982 | Lee | 432/253 |
| 4,640,223 A | | 2/1987 | Dozier | |
| 4,993,559 A | * | 2/1991 | Cota | 211/41.18 |
| 5,494,524 A | * | 2/1996 | Inaba et al. | 118/728 |
| 5,752,609 A | * | 5/1998 | Kato et al. | 211/41.18 |
| 5,788,088 A | * | 8/1998 | Kao | 211/40 |
| 5,931,662 A | * | 8/1999 | Adachi et al. | 432/6 |
| 6,287,112 B1 | | 9/2001 | Van Voorst Vader et al. | |
| 2003/0121533 A1 | * | 7/2003 | Bottos et al. | 134/25.4 |
| 2004/0022607 A1 | * | 2/2004 | Lim et al. | 414/222.01 |
| 2005/0205502 A1 | * | 9/2005 | Brown et al. | 211/41.18 |
| 2006/0226094 A1 | * | 10/2006 | Cho et al. | 211/41.18 |
| 2009/0008346 A1 | * | 1/2009 | Aihara et al. | 211/41.18 |
| 2009/0175707 A1 | * | 7/2009 | Bonora | 414/222.01 |

* cited by examiner

*Primary Examiner* — Jennifer E. Novosad
(74) *Attorney, Agent, or Firm* — Weingarten, Schurgin, Gagnebin & Lebovici LLP

(57) ABSTRACT

Wafer boat for holding semiconductor wafers in a spaced vertical arrangement during processing, said wafer boat comprising a plurality of vertically spaced holding positions for receiving and supporting said wafers in a substantially horizontal orientation, wherein the holding positions can be accessed from a front side of the wafer boat to allow for insertion and removal of a wafer, wherein at least one holding position comprises a back support for engaging a back side portion of a wafer and two lateral supports for engaging opposite lateral side portions of the wafer, and wherein the back support is disposed at a lower position than said two lateral supports such that sagging of a front side portion of an inserted wafer near the front side of the wafer boat due to gravity is at least partially compensated for.

16 Claims, 3 Drawing Sheets

WAFER BOAT

TECHNICAL FIELD

The invention relates to the field of semiconductor manufacturing, and in particular to a wafer boat for holding semiconductor wafers during processing in a batch furnace.

BACKGROUND OF THE INVENTION

In the course of a semiconductor manufacturing process, a semiconductor wafer may be subjected to a variety of processing steps such as for example heat treatment, oxidation or chemical vapour deposition. In order to execute these processing steps efficiently, a plurality of wafers is commonly loaded onto a so called wafer boat, i.e. a carrier for holding the semiconductor wafers in a spaced arrangement during processing in a furnace or reactor. Wafer boats are usually used vertically, that is, the wafers lie horizontally, one above the other. The probably most common type of wafer boat comprises three or more vertically oriented, parallel rods, which extend between a top member and a bottom member. In the rods, vertically spaced recesses are formed at corresponding heights. Each recess serves as a support arranged for engaging a side portion of a wafer, and recesses at the same height define a holding position for receiving and supporting a wafer in a substantially horizontal orientation. To minimize gravitational stress on a wafer, at least two of the rods are located toward a front side of the wafer boat—where the wafers are inserted into and removed from the holding positions—, and at least one rod is located at a back side of the boat. As the arrangement of the rods relative to the wafers is subject to the requirement that it must be possible to insert and remove wafers into and from the wafer boat, the above-described configuration commonly amounts to a wafer boat in which a little less than half of each inserted wafer is unsupported and freely hanging. Due to its own weight, this unsupported part of the wafer tends to sag.

Wafer handling equipment including an end effector for insertion and removal of semiconductor wafers into and from the wafer boat requires that the space between any two consecutively stacked wafers is accessible and allows for some maneuvering of the end effector. For example, in order to pick up one or more wafers from a wafer boat after processing, the end effector must be able to reach the interstitial space(s) between one or more pairs of wafers in order to engage the wafers at suitable positions, such as their respective centers. Sagging of the wafers causes the accessibility of the space between any two wafers to diminish, and reduces the effective room available for maneuvering. Thusfar this problem has been dealt with by increasing the vertical spacing between the holding positions of a wafer boat, which results in a decreased wafer capacity per boat, and thus a reduced process efficiency. It is an object of the present invention to alleviate or overcome aforesaid problem associated with the sagging of the wafers without said shortcomings.

SUMMARY OF THE INVENTION

In accordance with one, aspect of the invention, a wafer boat for holding semiconductor wafers in a spaced vertical arrangement during processing is provided. The wafer boat includes a plurality of vertically spaced holding positions for receiving and supporting the wafers in a substantially horizontal position. The holding positions can be accessed from a front side of the wafer boat to allow for insertion and removal of a wafer. At least one holding position includes a back support for engaging a back side portion of a wafer and two lateral supports for engaging opposite lateral side portions of the wafer. The back support is arranged at a lower position than the two lateral supports such that sagging of a front side portion of an inserted wafer near the front side of the wafer boat due to gravity is at least partially compensated for.

In accordance with another aspect of the invention, the same principle may applied to so called shield elements or shield rings that a wafer boat may be fitted with. A shield ring is associated with a certain holding position in the wafer boat, and serves as an extension of the deposition surface of a wafer being treated, in order to avoid end effects and to improve the uniformity of the deposition that takes place on the actual wafer surface. —An example of such a wafer boat with shield rings is described in applicant's patent U.S. Pat. No. 6,287, 112. Note however, that the shield rings mentioned below in relation to the present disclosure do not support any wafers; they merely surround them. —The wafer boat according to this aspect of the present disclosure includes at least one back rod and at least two lateral rods which extend vertically between a first end member at a first extremity of the wafer boat and a second end member at a second extremity of the wafer boat. The rods are provided with recesses to define supports of a plurality of vertically spaced holding positions for receiving and supporting the wafers in a substantially horizontal position. The holding positions are accessible from a front side of the wafer boat to allow for insertion and removal of the wafers. At least one holding position is provided with a shield element having an inner circumference arranged for enclosing an outer circumference of a wafer to be held by said holding position. Opposite lateral side portions of the shield element are connected to the lateral rods, and a back side portion of the shield element is connected to the back rod at a lower position than that at which the lateral side portions of the shield element are connected to the lateral rods, such that sagging of a front side portion of the shield element near the front side of the wafer boat due to gravity is at least partially compensated for.

The above and other features of the invention will be fully understood from the following detailed description and the accompanying drawings, in which:

DETAILED DESCRIPTION OF THE INVENTION

Figure 1:
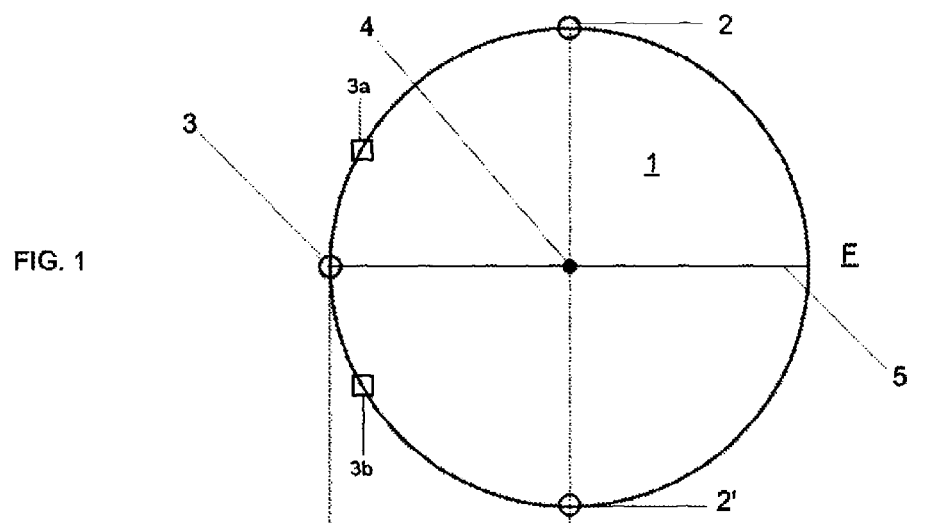
FIG. 1 shows a schematic top view of a circular wafer inserted into a wafer boat and supported by one back support and two lateral supports.

FIG. 1 shows a schematic top view of a circular wafer 1 inserted substantially horizontally into a holding position of a wafer boat. Any wafers in the wafer boat situated above the depicted wafer 1 and a possible top end member of the wafer boat are not indicated for reasons of clarity. The wafer 1 is supported by two lateral supports 2, 2' and one back support 3, each of which may be formed as a recess in a vertical rod that is part of the structure of the wafer boat. The two lateral supports 2, 2' are disposed approximately diametrically with respect to the geometrical center 4 of the wafer 1, yet slightly offset toward the front side F of the wafer boat for proper balance of the wafer 1, and have the same vertical coordinate or height. The back support 3 is disposed opposite the front side F of the wafer boat, i.e. the side from which wafers are inserted into and removed from the wafer boat. The depicted spatial arrangement of the three supports 2, 2', 3 ensures a maximum of support for the wafer 1 at the cost of a minimum of useful wafer surface area, subject to the requirement that the holding position defined by the supports 2, 2', 3 is accessible from the front side F of the wafer boat. However, both the positions of the supports along the circumference of a wafer and the number of supports supporting a single wafer may be varied in a practical wafer boat without preventing the present invention from being implemented. For example, the number of supports may be increased from three, e.g., the supports 2, 2' and 3 as shown in FIG. 1, to four, possibly by providing an extra vertical rod with vertically spaced recesses therein. Such a four rod wafer boat may be used to provide a series of vertically spaced holding positions wherein each holding position has two back supports 3a, 3b (indicated in FIG. 1) and two lateral supports 2 2'. The two lateral supports 2, 2' may be disposed diametrically with respect to the center of a circular wafer to be held, whereas the two back supports 3, 3a may be disposed along the back portion of the wafer, preferably such that the shortest distance between any two adjacent supports at the back side of the boat measured along the circumference of the wafer is about the same. Thus, though the present invention is described primarily with regard to a wafer boat with three supports per holding position, arranged along the circumference as shown FIG. 1, it should be born in mind that neither the depicted number of supports nor their depicted circumferential positions are crucial to the invention. In cases where more than three supports are employed to define a wafer holding position, the two supports closest to the front side of the wafer boat may generally be referred to as the lateral supports, whereas the supports disposed along the back edge portion of the wafer may be generally referred to as the back supports.

Figure 2:
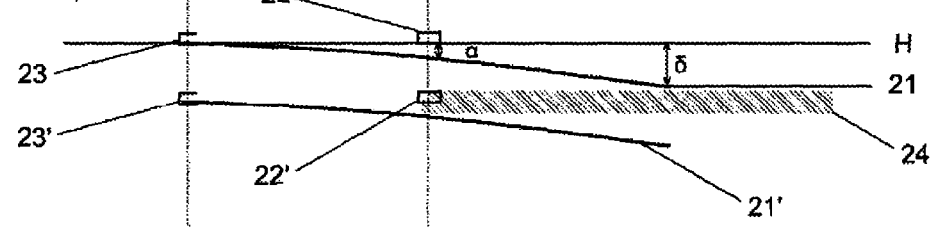
FIG. 2 shows a schematic side view of the centerline sections of two consecutively stacked wafers in a known wafer boat.

FIG. 2 schematically shows in a side view how, in a known wafer boat, with its supports circumferentially arranged as shown in FIG. 1, the centerline sections 21, 21' of two consecutively stacked wafers sag under the action of gravity. The centerline section of a wafer is thereby defined as the section of the wafer along its centerline, i.e. the line extending from the back support through the geometrical center of the wafer. For example, in FIG. 1 the centerline of the wafer 1 is marked 5. Given the arrangement of back and lateral supports of a wafer boat as shown in FIG. 1, it is the centerline section of a wafer that undergoes the maximum extent of sagging.

In known wafer boats, the back support(s) and the lateral supports of a holding position are disposed at the same vertical coordinate. This can be seen from FIG. 2, in which the back supports 23, 23' of two vertically spaced holding positions are located at the same height as the (pairs of) corresponding lateral supports 22 and 22' respectively. Consequently, the centerline sections 21, 21' of any two inserted wafers deflect increasingly from their horizontals H as they approach the front side F of the wafer boat. That is, they deflect increasingly from their ideal, i.e. no gravity, positions. —Note that, for reasons of clarity, the horizontal H is shown only for the upper holding position in which a wafer with centerline section 21 is located. —The distance by which the centerline section 21 of a wafer deflects from its horizontal H near the center 4 is denoted symbolically by $\alpha$; the distance by which the centerline section 21 deflects from its horizontal H at the front side F of the wafer is denoted symbolically by $\delta$. Typically, for a wafer with a diameter of 300 mm, a is about 0.3 mm, whereas $\delta$ is about 0.6 mm. Obviously, for wafers with larger diameters, such as a 450 mm wafer, these figures will be higher. The larger the extent of deflection of the centerline sections 21, 21' of the wafers near the front side F of the wafer boat, the less accessible the space between the wafers, and the less space is available to a horizontally operated end effector to reach in, and/or to maneuver, between them. To illustrate this, the effectively available maneuvering space for an end effector in the circumstances shown in FIG. 2 is indicated by the diagonally hatched area 24.

Figure 4:
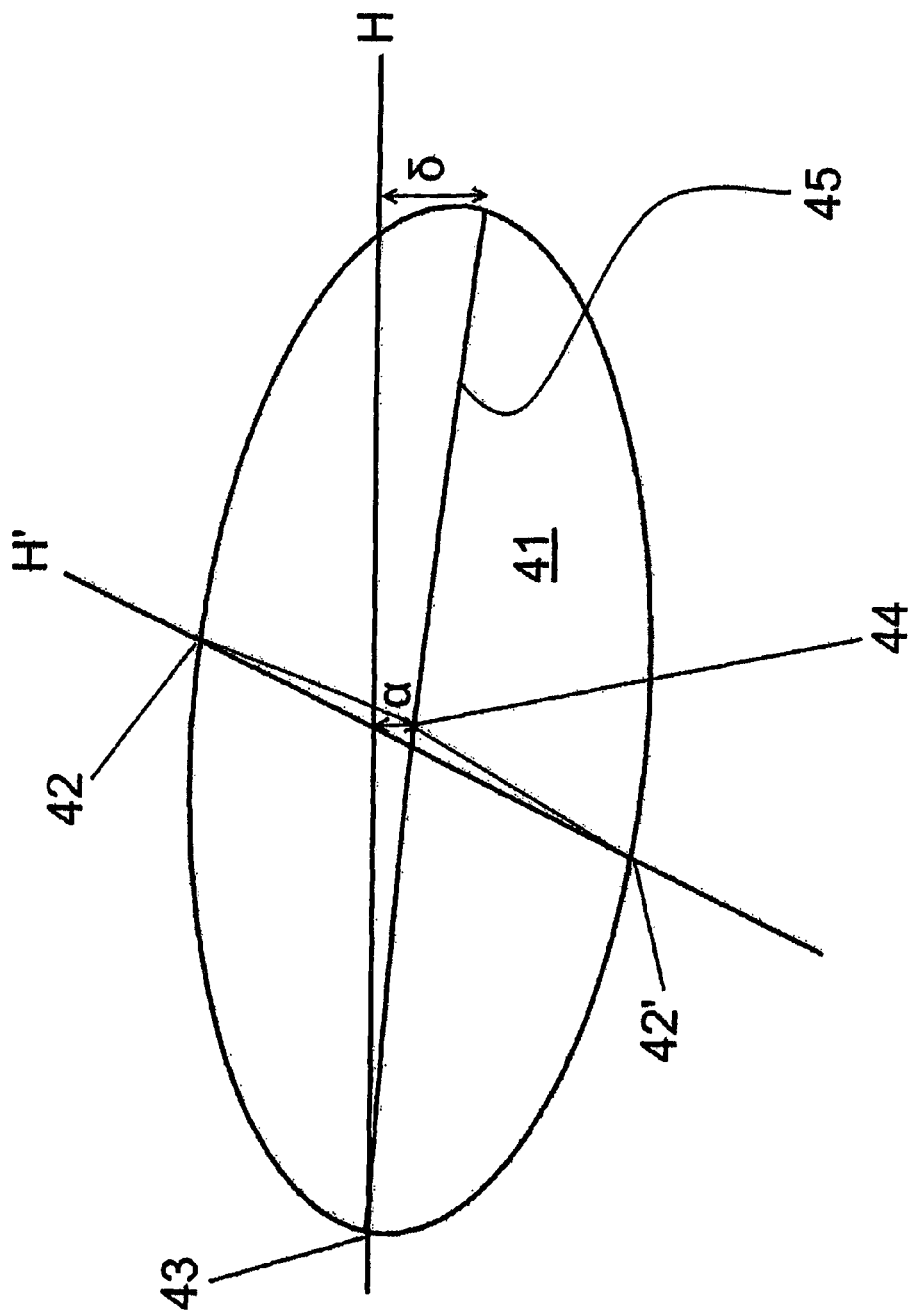
FIG. 4 shows a schematic perspective view of a circular wafer inserted into a known wafer boat.

As an aid in visualizing the three dimensional sagging of a wafer inserted into a known wafer boat, FIG. 4 has been included. The figure shows a wafer 41, supported by two lateral supports 42, 42' and one back support 43 which all have the same vertical coordinate. The lines H and H' define the horizontal plane in which the wafer 41 would extend if no sagging would occur—i.e. no gravity were present. As can be seen however, the wafer does sag. The extent of sagging relative to the horizontal plane is indicated both for the center 44 of the wafer, where the wafer sags a distance $\alpha$, and for the extreme end of the front side portion of the wafer 41, which is located on its centerline 45. Here maximum sagging occurs, denoted by $\delta$.

Figure 3:
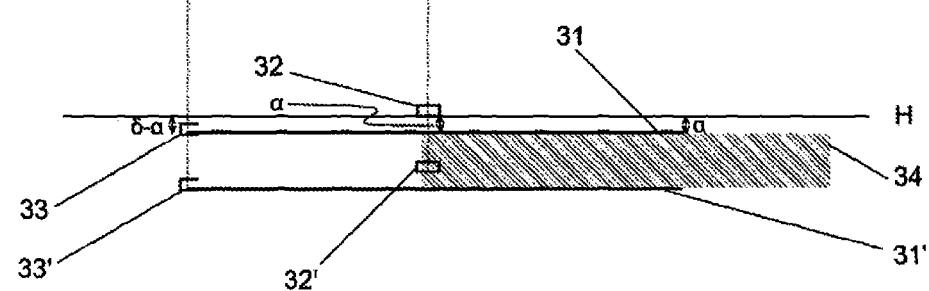
FIG. 3 shows a schematic side view of the centerline sections of two consecutively stacked wafers in a wafer boat according to the present invention.

FIG. 3 shows a schematic side view of the centerline sections 31, 31' of another two consecutively stacked wafers, this time in a wafer boat according to the present invention. Again, the two wafers are supported by back supports 33 and 33' respectively, and (pairs of) lateral supports 32 and 32' respectively, while the general arrangement of the supports along the circumference of the wafers is in agreement with the schematic top view shown in FIG. 1. However, relative to the situation shown in FIG. 2, the back supports 33, 33' have been lowered, and been disposed below their associated (pairs of) lateral supports 32, 32'. Consequently, though the centerline sections 31, 31' of the wafers still undergo sagging due to gravity, their front ends, i.e. their extremes near the front side F of the wafer boat, have moved upward relative to the situation shown in FIG. 2. As can be seen clearly from FIG. 3, the immediate effects thereof are an increased accessibility of the space between the wafers, and an increased maneuvering space 34 for any piece of wafer handling equipment for inserting wafers into, and removing wafers from the wafer boat.

To achieve an optimal front end orientation of the centerline sections 31, 31' of any two wafers, the back supports 33, 33' of the holding positions should be disposed a distance $\delta-\alpha$ below the vertical positions of their associated (pairs of) lateral supports 32 and 32' respectively. The definitions of $\alpha$ and $\delta$ were given before and are illustrated in FIG. 2. By disposing the back support of a holding position a distance $\delta-\alpha$ below the position of the lateral supports of that holding position, the maximum deflection of the front end of an inserted wafer is reduced from $\delta$ to approximately a whereas the deflection at the center of the wafer, $\alpha$, remains the same. Consequently, neither the center nor the front end of an inserted wafer sags more than a distance $\alpha$ relative to its no-gravity position, and both said wafer parts are located at about the same height. This, for example, allows an end effector that supports wafers at their centers to be inserted easily between any two or more wafers placed in a wafer boat in order to pick them up after processing. Such an end effector does not need to be inserted all the way to the back edge of a wafer to be picked up, and any curvature of the wafer beyond its center thus forms no obstacle. In case of the 300 mm wafer mentioned before, with δ being approximately 0.6 mm and a being approximately 0.3 mm, offsetting the back supports 33, 33' by a distance δ−α leads to a situation wherein a α≈δ−α≈0.3 mm. This means that the centerline section of a wafer from back to front extends approximately parallel to the horizontal H, as depicted in FIG. 3. In this most advantageous situation, wafer centerline sections mimic no-gravity circumstances, which creates an optimal accessibility of the space between two wafers, and allows an end effector to reach all the way to the back edge of a wafer if desired. Of course, a similar result may be also achieved for wafers with other diameters.

As will be understood by one skilled in the art, in case more than one back support is used in a single holding position, the individual vertical positions of these back supports are to be chosen such that they effectively position the front side portion of the wafer at a suitable level, optimally such that the front end of an inserted wafer sags approximately a distance α. Indeed, this result may be achieved without any individual back support being disposed at a distance δ—α below the lateral supports.

It is worth noting that back supports are not to be arranged at positions so low relative to the positions of the associated lateral supports, that the front end portion of an inserted wafer is lifted above its ideal (i.e. no-gravity) position such that sagging of the front end portion of the wafer would be overcompensated for. This would indeed not solve the problem addressed by the present disclosure as it decreases the accessibility of the interstitial spaces between wafers in much the same way as gravity itself does. Other issues involved in semiconductor manufacturing, which are not related to wafer sagging, might be dealt with by, an alignment of wafer supports that is offset from a horizontal alignment. U.S. Pat. No. 4,640,223, for example, discloses a chemical vapour deposition reactor for deposition on substrates. The reactor is adapted for receiving a wafer boat holding a plurality of wafer supports, each support comprising a support plate upon a top surface of which a wafer can rest in flat surface-to-surface contiguity. In processing a wafer according to the invention disclosed by U.S. Pat. No. 4,640,223, it is essential that the wafer is heated and cooled uniformly to avoid crystal slip. As disclosed in U.S. Pat. No. 4,640,223, this is partially achieved by tilting the wafer with respect to the horizontal to expose more of its surface to heater radiation.

As mentioned before, the principle of lowering the back support of an object to alleviate or overcome the negative accessibility/maneuverability effects caused by sagging of its front portion, may also be applied to shield rings. Therefore, all the clarifications given above with regard to wafer supports are, mutatis mutandis, equally applicable to shield ring supports. Nevertheless, some additional clarifying remarks will be made here.

Figure 5:
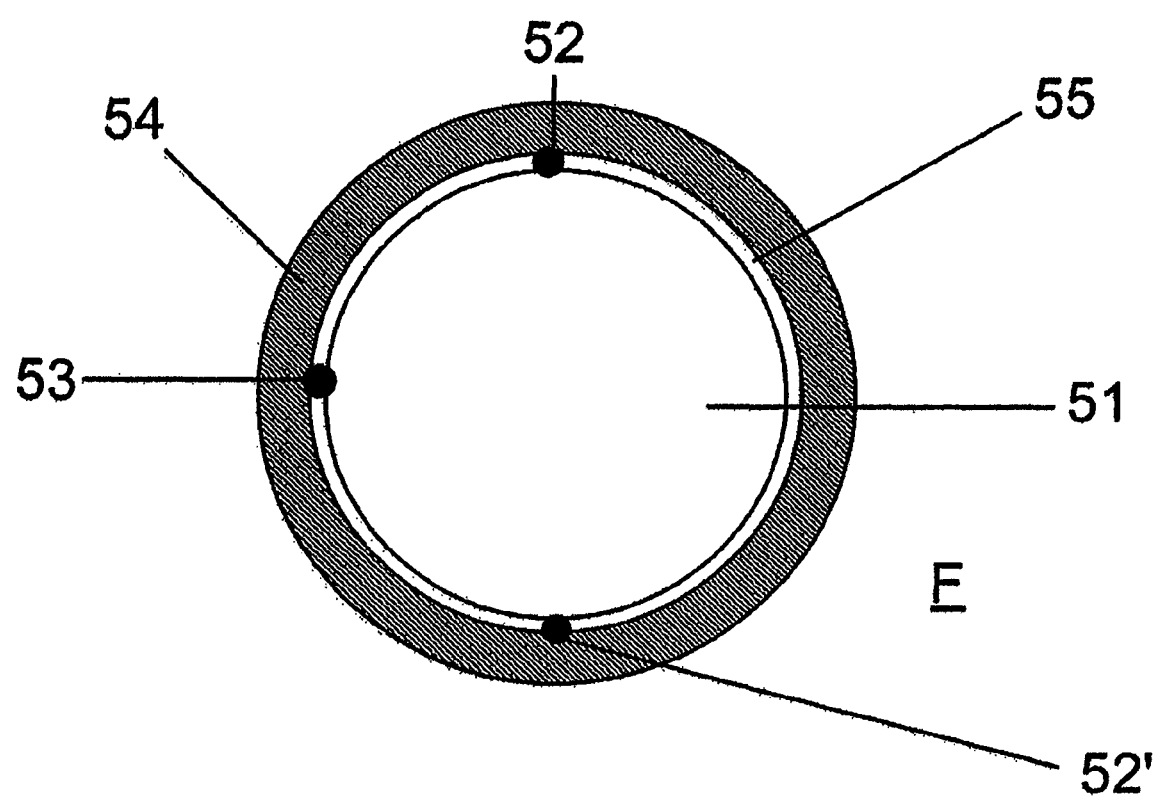
FIG. 5 shows a schematic top view of a circular wafer inserted into a wafer boat, supported by one back support and two lateral supports and enclosed by a shield ring.

FIG. 5 shows a schematic top view of a circular wafer 51 inserted into a wafer boat. The wafer 51 is supported by one back support 53 and two lateral supports 52, 52' as described above (compare FIG. 1) and is enclosed by a shield ring 54. The inner diameter of the shield ring 54 is such that it fits snugly around a cylindrical envelope of the wafer boat. The ring shaped space 55 between the shield ring 54 and the inserted wafer 51 can be very small, but is shown enlarged in FIG. 5 for clarity. The shield ring 51 may for example be affixed to the vertical rods by means of welding. In order to counteract the effects of sagging of the free hanging front side portion of the shield rings, the position at which the back side portion is affixed to the back rod is displaced downward relative to the vertical positions of the lateral connections.

It goes without saying that the above-described two aspects of the invention may well be combined in a single wafer boat, creating a wafer boat fitted with shield rings wherein both the supports for the wafers and the connections of the shield rings to the wafer boat structure are positioned such that sagging of the wafers and the shield rings near a front side is, at least partially, compensated for. Though implementing one aspect of the invention in a wafer boat with shield rings will, alleviate accessibility/maneuverability issues, an optimal result will in many situations be attained first after implementation of both aspects.

While the invention has been described with reference to certain embodiments, it will be understood by those skilled in the art that various changes may be made and equivalents may be substituted for elements thereof without departing from the scope of the invention. The wafer supports, for example, need not necessarily be formed as recesses, but may be provided as relatively small brackets that project from the vertical rods of the wafer boat structure. Further, as discussed above, the number and positions of the supports relative to the wafer may be varied in accordance with the specific application at hand. In addition, many modifications may be made to adapt to a particular situation or material to the teachings of the invention without departing from the essential scope thereof. Therefore, it is intended that the invention not be limited to any particular embodiment disclosed for carrying out this invention, but that the invention includes all embodiments falling within the scope of the appended claims.

The invention claimed is:

1. Wafer boat for holding wafers in a spaced vertical arrangement during processing, said wafer boat comprising a plurality of vertically spaced holding positions for receiving and supporting corresponding ones of said wafers in a substantially horizontal orientation, wherein the holding positions can be accessed from a front side (F) of the wafer boat to allow for insertion and removal of a wafer, wherein at least one holding position comprises one or more back supports for engaging a wafer to support a back edge of said wafer and two lateral supports for engaging and supporting opposite lateral side portions of the wafer, and wherein the one or more back supports are disposed at a position that supports said wafer back edge a first predetermined distance vertically downward with respect to said two lateral supports, wherein a deflection value α represents a distance a centerline section of an inserted wafer deflects from the horizontal near the center due to gravity and a sagging value δ represents a distance by which the centerline section at the front side portion (F) of an inserted wafer sags from the horizontal due to gravity when the back edge and the two lateral side portions are located in the same horizontal plane, where δ>α, and wherein said first predetermined distance is chosen such that an amount a front side portion of an inserted wafer near the front side of the wafer boat sags due to gravity is limited to be not greater than α.

2. Wafer boat according to claim 1 for holding wafers in a spaced vertical arrangement during processing, said back support comprising at least one back rod and said two lateral supports comprising two lateral rods which extend substantially vertically between a first end member at a first extremity of the wafer boat and a second end member at a second extremity of the wafer boat, said rods being provided with supports to define said plurality of vertically spaced holding positions for receiving and supporting said wafers in a substantially horizontal position, wherein at least one holding position is provided with a shield element having an inner circumference arranged for enclosing an outer circumference of a wafer to be held by said holding position, wherein opposite lateral side portions of the shield element are connected to the lateral rods at a first shield vertical position, and wherein a back side portion of the shield element is connected to the back rod at a second shield vertical position located a second predetermined distance below the first shield vertical position, said second predetermined distance chosen such that sagging of a front side portion of the shield element near the front side of the wafer boat due to gravity is at least partially compensated for.

3. Wafer boat according to claim 2, that is arranged for holding substantially flat, circular wafers, wherein said two lateral rods are disposed approximately diametrically with respect to the geometrical center of an inserted wafer and offset to the front side of the wafer boat, and wherein the at least one back rod is disposed substantially equidistantly from said two lateral rods.

4. Wafer boat according to claim 2, that is arranged for holding substantially flat, circular wafers.

5. Wafer boat according to claim 2, that is arranged for holding substantially flat, circular wafers, wherein the at least one holding position comprises two back rods and two lateral rods, wherein said two lateral rods are disposed substantially diametrically with respect to the geometrical center of an inserted wafer, and wherein the two back rods are disposed along the back portion of the wafer, such that the back portion extending between the two lateral rods is equidistantly divided by the two back rods.

6. Wafer boat according to claim 1, that is arranged for holding substantially flat, circular wafers, wherein said two lateral supports are disposed approximately diametrically with respect to the geometrical center of an inserted wafer and offset to the front side of the wafer boat, and wherein the at least one back support is disposed substantially equidistantly from said two lateral supports.

7. Wafer boat according to claim 1, wherein the first predetermined distance is approximately $\delta-\alpha$.

8. Wafer boat according to claim 1, that is arranged for holding substantially flat, circular wafers.

9. Wafer boat according to claim 1, that is arranged for holding substantially flat, circular wafers, wherein the at least one holding position comprises two back supports and two lateral supports, wherein said two lateral supports are disposed substantially diametrically with respect to the geometrical center of an inserted wafer, and wherein the two back supports are disposed along the back portion of the wafer, such that the back portion extending between the two lateral supports is equidistantly divided by the two back supports.

10. Wafer boat for holding wafers in a spaced vertical arrangement during processing, said wafer boat comprising at least one back rod and two lateral rods which extend substantially vertically between a first end member at a first extremity of the wafer boat and a second end member at a second extremity of the wafer boat, said rods being provided with supports to define a plurality of vertically spaced holding positions for receiving and supporting said wafers in a substantially horizontal position, said holding positions being accessible from a front side of the wafer boat to allow for insertion and removal of a wafer, wherein at least one holding position is provided with a shield element attached to said back and lateral rods and having an inner circumference arranged for enclosing an outer circumference of a wafer to be held by said holding position, wherein opposite lateral side portions of the shield element are connected to the lateral rods at a first vertical position, and wherein a back side portion of the shield element is connected to the back rod at a second vertical position, which second vertical position is located a first predetermined distance below the first, wherein a deflection value $\alpha$ represents a distance a centerline section of the shield element deflects from the horizontal near the center due to gravity and a sagging value $\delta$ represents a distance by which the centerline section at the front side portion (F) of the shield element sags from the horizontal due to gravity when the back side portion and the two lateral side portions are located in the same horizontal plane, where $\delta>\alpha$, and wherein said first predetermined distance is chosen such that an amount a front side portion of the shield element near the front side of the wafer boat sags due to gravity is limited to be not greater than $\alpha$.

11. Wafer boat according to claim 10, that is arranged for holding substantially flat, circular wafers, wherein said two lateral rods are disposed approximately diametrically with respect to the geometrical center of an inserted wafer and offset to the front side of the wafer boat, and wherein the at least one back rod is disposed substantially equidistantly from said two lateral rods.

12. Wafer boat according to claim 11, wherein:
the first predetermined distance is approximately $\delta-\alpha$.

13. Wafer boat according to claim 10, that is arranged for holding substantially flat, circular wafers.

14. Wafer boat according to claim 10, that is arranged for holding substantially flat, circular wafers, wherein the at least one holding position comprises two back rods and two lateral rods, wherein said two lateral rods are disposed substantially diametrically with respect to the geometrical center of an inserted wafer, and wherein the two back rods are disposed along the back portion of the wafer, such that the back portion extending between the two lateral rods is equidistantly divided by the two back rods.

15. A method of arranging a plurality of wafers during processing, the method comprising:
arranging each wafer in the plurality of wafers in a respective holding position, the holding positions being in a vertically spaced arrangement with one another;
maintaining each wafer in the respective holding position by supporting the wafer at two opposite lateral side portions and at a back side portion thereof such that the wafer can be accessed from a front side (F) portion of the wafer to allow for insertion and removal;
positioning the two opposite lateral side support portions in a same first horizontal plane; and
positioning the back side portion in a second horizontal plane, different from the first horizontal plane, that is spaced a first predetermined distance vertically downward with respect to the first horizontal plane,
wherein a deflection value $\alpha$ represents a distance a centerline section of the inserted wafer deflects from the horizontal near the center due to gravity and a sagging value $\delta$ represents a distance by which the centerline section at the front side portion (F) of the wafer sags from the horizontal due to gravity when the first and second horizontal planes are the same, where $\delta>\alpha$, and
wherein said first predetermined distance is chosen such that an amount the front side portion (F) of the inserted wafer sags due to gravity is approximately $\alpha$.

16. The method of claim 15, further comprising setting the first predetermined distance to approximately $\delta-\alpha$.

* * * * *

UNITED STATES PATENT AND TRADEMARK OFFICE
CERTIFICATE OF CORRECTION

| | | |
|---|---|---|
| PATENT NO. | : 7,971,734 B2 | Page 1 of 1 |
| APPLICATION NO. | : 12/011981 | |
| DATED | : July 5, 2011 | |
| INVENTOR(S) | : Christianus Gerardus Maria De Ridder et al. | |

It is certified that error appears in the above-identified patent and that said Letters Patent is hereby corrected as shown below:

Column 4, line 4, "a is about" should read --α is about--;

Column 4, line 56, "a whereas" should read --α whereas--;

Column 5, line 1, "and a" should read --and α--; and

Column 5, line 3, "wherein a" should read --wherein--;

Signed and Sealed this
Second Day of October, 2012

David J. Kappos
*Director of the United States Patent and Trademark Office*